US008445312B2

(12) United States Patent
Mihailetchi et al.

(10) Patent No.: US 8,445,312 B2
(45) Date of Patent: May 21, 2013

(54) METHOD OF MANUFACTURING CRYSTALLINE SILICON SOLAR CELLS USING CO DIFFUSION OF BORON AND PHOSPHORUS

(75) Inventors: Valentin Dan Mihailetchi, Groningen (NL); Yuji Komatsu, Alkmaar (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 461 days.

(21) Appl. No.: 12/742,682

(22) PCT Filed: Nov. 13, 2008

(86) PCT No.: PCT/NL2008/050724
§ 371 (c)(1),
(2), (4) Date: Sep. 3, 2010

(87) PCT Pub. No.: WO2009/064183
PCT Pub. Date: May 22, 2009

(65) Prior Publication Data
US 2010/0319771 A1  Dec. 23, 2010

(30) Foreign Application Priority Data

Nov. 13, 2007 (NL) .................................... 2000999

(51) Int. Cl.
H01L 21/02 (2006.01)
(52) U.S. Cl.
USPC .......... 438/89; 438/90; 438/92; 257/E21.159; 257/E21.347; 257/E31.002; 257/E31.119; 257/E31.127
(58) Field of Classification Search
USPC ................... 438/57–73, 89–98; 257/E21.159, 257/211, 347, 31.002–4, 119–127
See application file for complete search history.

(56) References Cited

U.S. PATENT DOCUMENTS

| 4,451,969 | A  | * | 6/1984  | Chaudhuri      | 438/62  |
|-----------|----|---|---------|----------------|---------|
| 4,557,037 | A  | * | 12/1985 | Hanoka et al.  | 438/57  |
| 5,082,791 | A  | * | 1/1992  | Micheels et al.| 438/62  |
| 5,792,280 | A  | * | 8/1998  | Ruby et al.    | 136/258 |
| 7,179,987 | B2 | * | 2/2007  | Fath et al.    | 136/261 |
| 7,435,361 | B2 | * | 10/2008 | Carroll et al. | 252/514 |
| 7,838,400 | B2 | * | 11/2010 | Borden         | 438/513 |
| 8,187,505 | B2 | * | 5/2012  | Carroll et al. | 252/514 |
| 8,309,446 | B2 | * | 11/2012 | Weidman et al. | 438/558 |
| 2008/0057220 | A1 | * | 3/2008 | Bachrach et al.| 427/569 |
| 2009/0305456 | A1 | * | 12/2009 | Funakoshi     | 438/98  |
| 2010/0126565 | A1 | * | 5/2010 | Takeda et al.  | 136/252 |
| 2011/0114162 | A1 | * | 5/2011 | Zaks et al.    | 136/255 |
| 2011/0114168 | A1 | * | 5/2011 | Habermann      | 136/256 |
| 2011/0290320 | A1 | * | 12/2011 | Ito et al.    | 136/256 |
| 2012/0064659 | A1 | * | 3/2012 | Park et al.    | 438/71  |
| 2012/0227794 | A1 | * | 9/2012 | Gee et al.     | 136/252 |
| 2012/0270359 | A1 | * | 10/2012 | Kumar et al.  | 438/71  |
| 2012/0282722 | A1 | * | 11/2012 | Wenham et al. | 438/72  |

* cited by examiner

Primary Examiner — Michael Lebentritt
(74) Attorney, Agent, or Firm — Young & Thompson

(57) ABSTRACT

A method of manufacturing a crystalline silicon solar cell, subsequently including:
  providing a crystalline silicon substrate having a first side and a second side opposite the first side;
  pre-diffusing Phosphorus into a first side of the substrate to render a Phosphorus diffused layer having an initial depth;
  blocking the first side of the substrate;
  exposing a second side of the substrate to a Boron diffusion source;
  heating the substrate for a certain period of time and to a certain temperature so as to diffuse Boron into the second side of the substrate and to simultaneously diffuse the Phosphorus further into the substrate.

20 Claims, 5 Drawing Sheets

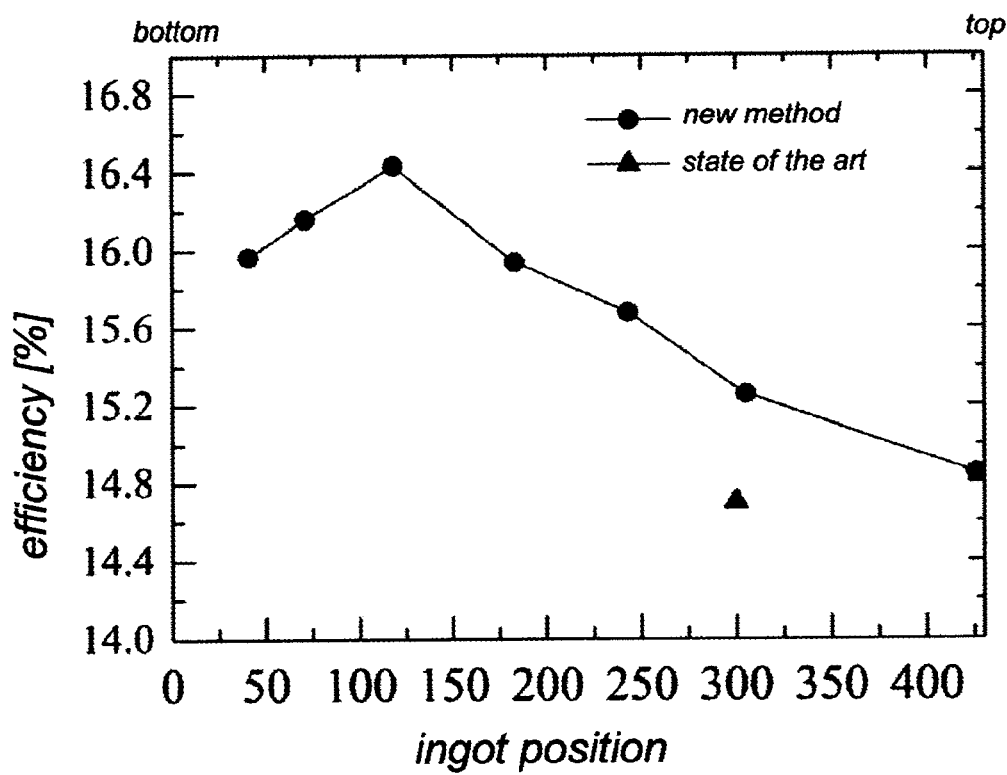

METHOD OF MANUFACTURING CRYSTALLINE SILICON SOLAR CELLS USING CO DIFFUSION OF BORON AND PHOSPHORUS

The present invention relates to the manufacture of a solar cell using a crystalline silicon (Si) substrate. An example of such a solar cell is a Boron-emitter n-base solar cells with a back side field resulting from a Phosphorous-diffusion.

When two kinds of diffusion processes (Boron and Phosphorous) are required, the higher temperature Boron-diffusion step is usually processed before the lower temperature Phosphorous-diffusion step, see for example T. Buck et al., Proceedings of 21st European Photovoltaic Solar Energy Conference (4-8 Sep. 2006, Dresden, Germany) p. 1264-1267. Such a process sequence requires a special protective layer to block Phosphorous from diffusing into the Boron-diffused side during the time of the Phosphorous diffusion step. Sometimes Boron diffuses out from the Boron-diffused layer to this protective layer and is depleted near the interface. This causes an increase of the sheet resistance of the emitter which leads to an increase of the series resistance of the solar cell manufactured through this process. Furthermore, additional process steps are required to remove the protective layer, or the optimal properties of the protective layer are compromised if it is retained on the Silicon substrate (for example, as passivation and anti-reflection coating).

On the other hand, if the Phosphorous diffusion step is processed before the Boron diffusion step, the Phosphorous-diffused side must be protected from Boron during the Boron diffusion step. Additionally, Phosphorous must be prevented sufficiently from diffusing into the Boron-side during the Phosphorous-diffusion because it cannot be easily compensated by Boron. Additionally, Phosphorous is effused from the Phosphorous-diffused layer at the temperature of the Boron diffusion and, therefore, Phosphorous is diffused together with Boron into the surface of the Boron-diffused layer. This hampers obtaining good properties of the Boron-doped emitter. Because of these difficulties, the Phosphorous diffusion prior to the Boron diffusion has hardly been attempted, or, when attempted, has not been successful in manufacturing a solar cell.

Although it is possible to form both Boron and Phosphorous diffusions at the same time by some methods, such as printing each diffusion source on one side prior to the diffusion process, such a method results in a compensation of Boron by Phosphorous at least at the edge of the Boron-side, because Phosphorous diffuses faster and is more soluble in Silicon, and therefore easily compensates Boron.

Other methods are known in which separate diffusions for Boron and Phosphorous are used, with wafers placed together in pairs. Two sides of two substrates touch each other to let them partly be protected from diffusion. This will limit the problems of compensation of Boron by Phosphorous, and vice versa, to the edge of the wafers. However, the edges of the wafers must subsequently be cut off, which significantly increases costs per Wp produced.

It is an object of the present invention to provide a method of manufacturing a solar cell out of a Si substrate using both Boron and Phosphorus diffusion in which at least one of the problems mentioned above is solved.

The object is achieved by a method of manufacturing a crystalline silicon solar cell, subsequently comprising:
providing a crystalline silicon substrate having a first side and a second side opposite said first side;
pre-diffusing Phosphorus into said first side of said substrate to render a Phosphorus diffused layer having an initial depth;
blocking said first side of said substrate;
exposing said second side of said substrate to a Boron diffusion source;
heating said substrate for a certain period of time and to a certain temperature so as to diffuse Boron into said second side of said substrate and to simultaneously diffuse said Phosphorus further into said substrate.

The present invention involves stabilizing and reducing the effused Phosphorous in the atmosphere during the Boron diffusion process, by diffusing the Phosphorous already to some extent into the surface prior to the Boron diffusion. This enables to remove the Phosphorous diffusion source before the Boron diffusion. The amount of the effused Phosphorous from the diffusion source is larger and more fluctuating than that from the Silicon surface where Phosphorous is already diffused-in. Therefore, this process improves the quality and reproducibility of the Boron-diffused p-type emitter. It also avoids the creation of an n-type edge on the Boron-diffused side and therefore avoids shunting of the solar cell.

In an aspect, the invention also relates to a solar cell manufactured by the method described above.

Further advantages and characteristics of the present invention will become clear on the basis of a description of a number of embodiments, in which reference is made to the appended drawings, in which.

Figure 6A:
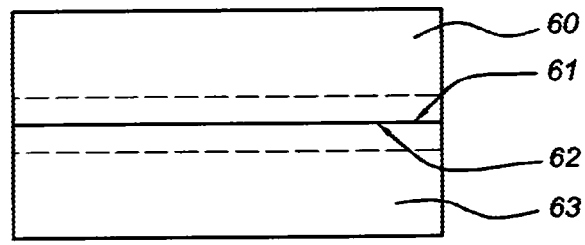
Figure 6B:
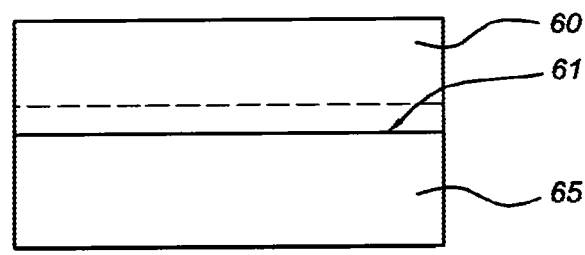
Figure 7:
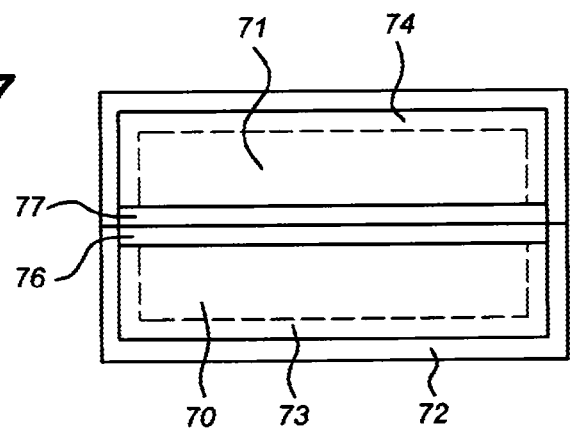

FIGS. 3A-3D diagrammatically show processing steps for making a P-diffused layer at one side of a substrate;

FIGS. 4A-4F diagrammatically show processing steps of an alternative method for manufacturing a P-diffused layer at one side of a substrate;

FIG. 5A-5D diagrammatically show processing steps for a possible third method for manufacturing the P-diffused layer at one side of the substrate;

FIGS. 6A, 6B shows two possible configurations for blocking one side of the substrate during a Boron diffusion step;

FIG. 7 diagrammatically shows a back-to-back configuration during a Boron diffusion step;

FIG. 8 is a graph showing the measured efficiency of solar cells produced by the method according to the invention as compared to state-of-the-art solar cells.

Figure 1:
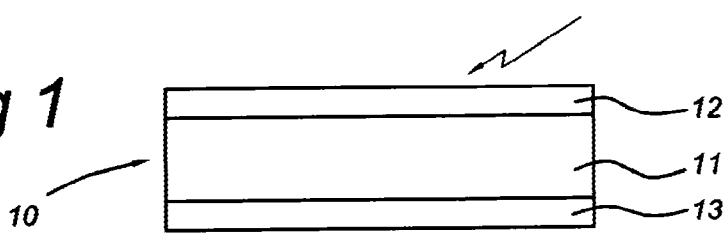
FIG. 1 shows an example of the structure of a solar cell produced by a method according to an embodiment of the invention.
Figure 2:
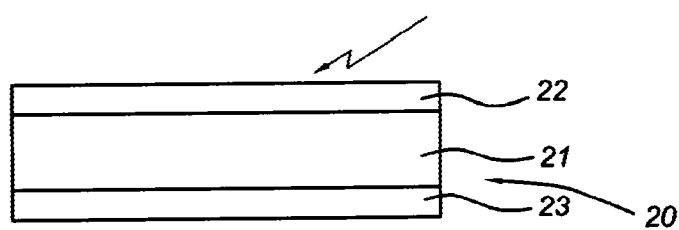
FIG. 2 shows another example in which a substrate of p-type Silicon.

FIG. 1 shows an example of the structure of a solar cell produced by a method according to an embodiment of the invention. A solar cell 10 comprises a n-type Silicon substrate 11 having a Boron-diffused layer 12 at one side and a Phosphorus-diffused layer 13 at the other side. It is noted that a practical solar cell structure also has metal contacts and an anti-reflection coating, but those components are not shown in the Figures. FIG. 2 shows another example in which a substrate 21 of p-type Silicon is processed so as to produce a Phosphorus-diffused layer 22 at one side and a Boron-diffused layer 23 at the other side. The solar cell of FIG. 1 is the preferred embodiment because its device performance is better than the one of FIG. 2. In the description below, embodiments of the manufacturing method of the solar cell shown in FIG. 1 (i.e. n-type substrate) are discussed.

The first step of this method is making a P-diffused layer at one side of the substrate. According to an embodiment, a substrate 30 is heated at 800~900° C. for 5~50 minutes in an atmosphere including a $O_2$ and $P_2O_5$ vapor. Then, all surfaces of the substrate 30 are covered with a $SiO_2$ film 31 comprising $P_2O_5$ (hereafter, $SiO_2:P_2O_5$). This $SiO_2$ grows from Si of the substrate 30 and oxygen, and $P_2O_5$ is incorporated into the $SiO_2$ film 31. At the interface of Silicon 33 and the $SiO_2:P_2O_5$ film 31, $P_2O_5$ is reduced into P and P diffuses into the core of the substrate 30 (see core 33 in FIG. 3B) until a depth of 0.01~1.0 μm. Thus far, the $SiO_2:P_2O_5$ film 31 and a P-diffused layer 32 are formed at all the surface of the silicon substrate 30. Next, the $SiO_2:P_2O_5$ film 31 is removed by dipping the substrate 30 in a 1~50% HF solution for about 0.5~10 minutes, or exposing the substrate 30 to a HF vapor, or etching it using reactive ion etching, see FIG. 3C. Next, the P-diffused layer 32 is etched out, except for one side, using a mixed solution of 1~30% HF and 0.1~50% $HNO_3$, or etching it using reactive ion etching. One side etching is possible by sealing the other side of the substrate 30 with an etch-block coating or by just floating the substrate 30 on the solution. As a result, the substrate 30 now comprises a P-diffused layer 32' at one side, see FIG. 3D.

Figure 3A:
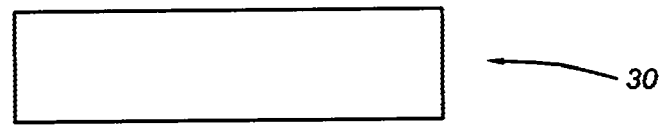
Figure 3B:
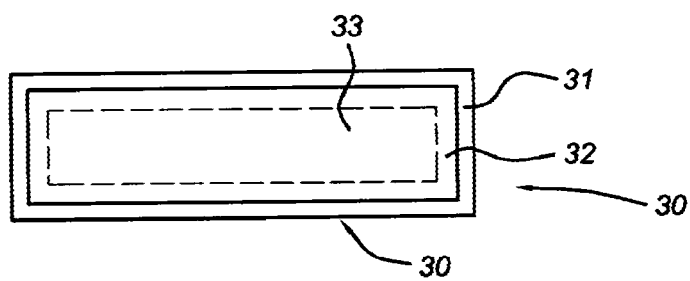
Figure 3C:
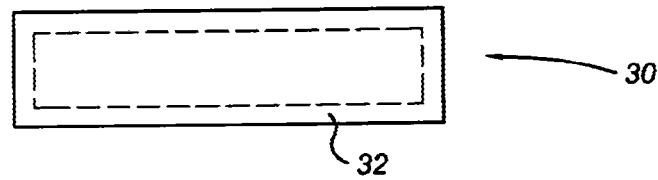
Figure 3D:
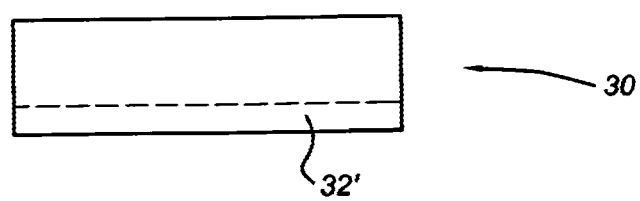
Figure 4A:
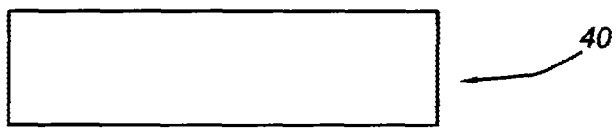
Figure 4B:
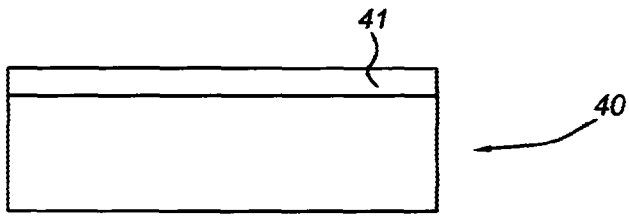
Figure 4C:
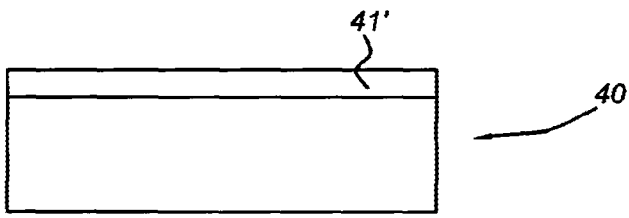
Figure 4D:
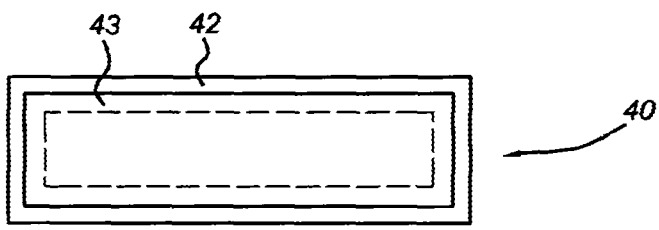
Figure 4E:
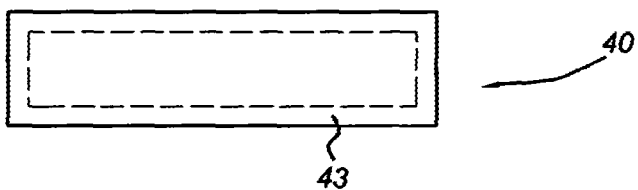
Figure 4F:
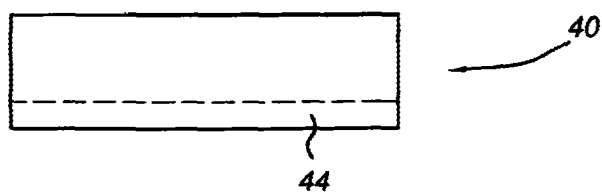
Figure 5A:
Figure 5B:
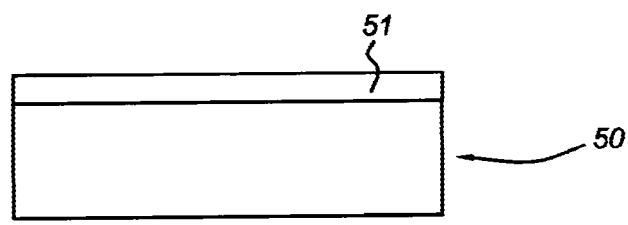
Figure 5C:
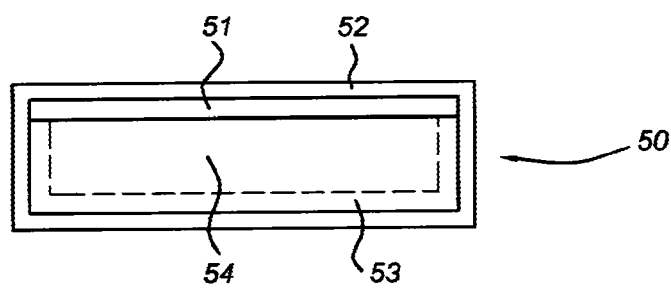
Figure 5D:
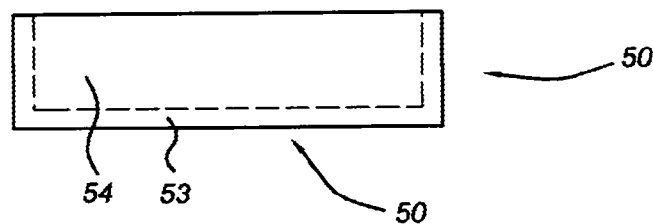

An alternative method for manufacturing a P-diffused layer at one side of a substrate is explained with reference to FIG. 4A-4F. First, one side of the surface of a substrate 40 is coated with either of liquid, paste, or gel 41 which includes $P_2O_5$ and $SiO_2$ fine particles by either of spin-coating, spray-coating, or printing, see FIG. 4B. The other sides of the substrate could be coated as well, but this does not influence the end result of this manufacturing method. Next, the coating 41 is heated at 250~500° C. The solvent evaporates or burns out when it includes organic matter. The $P_2O_5$ and $SiO_2$ remain in the coating, see FIG. 4C showing a coating 41'. Then in a further heating step, the substrate 40 is heated at 800~900° C. for 2~50 minutes. As a result, all the surfaces are covered with $SiO_2:P_2O_5$, see FIG. 4D. Oxygen from the atmosphere, and $P_2O_5$ from the first coating film 41' which goes out into the atmosphere. The P diffuses into the Si core just like in FIG. 3B, and a $SiO_2:P_2O_5$ film 42 and a P-diffused layer 43 are formed at all the surfaces of silicon substrate 40. Now, the $SiO_2:P_2O_5$ film 42 is removed using a 1~50% HF solution or some other known method. The P-diffused layer is etched out, except the side firstly coated, using mixed solution of 1~30% HF and 0.1~50% $HNO_3$, or reactive ion etching. One side etching is possible by sealing the other side with etch-block coating or just floating the substrate on the solution. The result is shown in FIG. 4F which depicts the substrate 40 having a P-diffused layer 44 at one side.

A possible third method for manufacturing the P-diffused layer at one side of the substrate is explained with reference to FIG. 5A-5D. First one side of a substrate 50 is blocked using a diffusion blocking layer on one side, see blocking layer 51. The blocking layer 51 can be formed using different processes listed below:

Coat the surface with either a liquid, paste, or gel which includes $SiO_2$ or $TiO_2$ or anything which does not diffuse into Silicon by spin-coating or spray-coating or printing. Heat the coating at 200~700° C., then the solvent evaporates.

Heat the substrate 50 at 850~1100° C. in a $O_2$ or $O_2+H_2O$ atmosphere for 0.5~ several hours. Then a $SiO_2$ film which is thicker than 0.1 μm is formed on all the surfaces. Remove the film on just one side by dipping the substrate 50 in a 1~10% HF solution.

Deposit >0.1 μm thick $SiO_2$ or SiN or $TiO_2$ or anything like that using chemical vapor deposition.

In a next step, P is diffused into a Si core 54 using the method as described with reference to FIG. 3B or 4D. A $SiO_2:P_2O_5$ layer 52 is formed and P diffuses in, but the blocking layer 51 prevents the P form diffusing into the Si core 54 at one side, see FIG. 5C. Then, the $SiO_2:P_2O_5$ layer 52 and the blocking layer 51 are removed by dipping the substrate 50 in a 1%~50% HF solution.

According to another embodiment, the diffusion of P on just one side of the substrate is achieved using a back-to-back diffusion method in which two substrates are contacting each other at their surface.

After the pre-diffusion of Phosphorus into the first side of the substrate, which was described above, that same first side of the substrate is blocked before the substrate is put in an oven for further processing. In an embodiment, the first side 61 of the substrate 60 is blocked by a first side 62 of another substrate 63. That other substrate may be a similarly processed substrate, see FIG. 6A. This way of blocking is referred to as back-to-back. One of the advantages of a back-to-back configuration is that less space is required in the oven as compared to blocking each substrate individually. Furthermore, the escape of phosphorus from the first side 61 is most effectively prevented because the facing substrate also has high phosphorus concentration, which keeps phosphorus concentration in better condition. FIG. 6B shows an alternative in which the substrate 60 is blocked by a substrate 65 that is not processed yet (i.e. a fresh substrate).

In the oven, the second side of the substrate is exposed to a Boron diffusion source. This Boron diffusion source may be a vapour source or a coating source. In the oven the substrate is heated for a certain period of time and to a certain temperature so as to diffuse Boron into the second side of the substrate and to simultaneously diffuse the Phosphorus further into said substrate (i.e. deeper than said initial depth). Successful results have been achieved with a Boron vapor source for the diffusion. Below, a specific description of an embodiment is described with reference to FIG. 7. Two substrates 70, 71 are put back-to-back into the oven and heated at 900~1000° C. for 30~120 minutes in an atmosphere including an $O_2$ and $B_2O_3$ vapor, which may produced by leading $N_2$ through $BBr_3$ liquid. Other liquid sources of Boron like $BCl_3$ or tremethylborate can also be used instead of $BBr_3$. Then, the exposed surfaces (i.e. those that are not blocked) are covered with a $SiO_2$ film 72 which includes $B_2O_3$ (hereafter, $SiO_2:B_2O_3$). At the interface of Si cores 70, 71 and the $SiO_2:B_2O_3$ film 72, B diffuses into Si until the depth of 0.01~1.0 μm to render B-diffused layers 73, 74. Part of the $B_2O_3$ may sneak into the slight gap between the substrates 70, 71, but the impact is very small because of the existence of heavily diffused P at those areas. Simultaneously, the P present in the P-diffused layers 76, 77 also diffuses further into the respective Si cores 70, 71 driven by the heat used. This will result in P-diffused layers that are deeper than their original depth.

The Boron diffusion of the example of FIG. 7 used vapor source diffusion, it will be clear to the skilled person that this method is also effective in the case of a coating source diffusion like described in the phosphorus diffusion step of FIGS. 4A-4F.

The combination of a pre-diffusion of Phosphorous with a further diffusion during the simultaneous diffusion of Boron and Phosphorous, leads to a solar cell having very good properties, as can be seen from FIG. 8. FIG. 8 shows a graph of solar cell efficiencies values fabricated on n-type multi crystalline substrates using the new method (as presented here) and the state-of-the-art method (see for example T. Buck et al., Proceedings of 21st European Photovoltaic Solar Energy Conference (4-8 Sep. 2006, Dresden, Germany) p. 1264-1267).

As a consequence of the manufacturing method described above, Phosphorous is diffused-in deeper than when Phosphorous is diffused-in individually (not in a simultanediffusion with Boron). When using the invention, a Phosphorous concentration in the substrate at 0.5 μm depth can be more than 100 times higher than that at 5 μm depth.

In the method according to the invention, Phosphorous may also diffuse into the Silicon on the Boron-side because a small amount of Phosphorous will effuse from the Phosphorous-side to the opposite side (i.e. the Boron-diffused side). However, on the Boron-side, the amount of the Phosphorous diffused-in is smaller than that of the Boron diffused-in, and the diffused layer can easily satisfy the proper conditions for a p-type emitter.

The amount of the Phosphorous diffused-in is still larger than the background doping of the substrate. The Phosphorous concentration at 0.2 μm deep may be more than 100 times higher than that at 5 μm deep.

The invention enables the manufacturing of a Boron doping profile which satisfies the required conditions for an emitter, without allowing Phosphorous of larger quantity than Boron to diffuse into the Boron-diffused side and without allowing Boron of larger quantity than Phosphorous to diffuse into the Phosphorous-diffused side.

It will be understood that variants will occur to those skilled in the art on reading the above text. Those variants are deemed to lie within the scope of the invention as described in the appended claims.

The invention claimed is:

1. Method of manufacturing a crystalline silicon solar cell, subsequently comprising:
    providing a crystalline silicon substrate having a first side and a second side opposite said first side;
    pre-diffusing Phosphorus into said first side of said substrate which renders a film comprising $SiO_2$ and $P_2O_5$ and a Phosphorus diffused layer having an initial depth;
    removing said $SiO_2$:$P_2O_5$ film from all sides of said substrate;
    blocking said first side of said substrate;
    exposing said second side of said substrate to a Boron diffusion source;
    heating said substrate for a certain period of time and to a certain temperature so as to diffuse Boron into said second side of said substrate and to simultaneously diffuse said Phosphorus further into said substrate.

2. Method according to claim 1, wherein said pre-diffusing Phosphorus into a first side of said substrate comprises:
    heating said substrate in an atmosphere including $O_2$ and $P_2O_5$ so as to produce the film comprising $SiO_2$ and $P_2O_5$ and an intermediate Phosphorus diffused layer on all sides of said substrate;
    etching out said a Phosphorus diffused layer except for said first side.

3. Method according to claim 1, wherein said pre-diffusing Phosphorus into a first side of said substrate comprises:
    forming a coating on said first side using a screen-printed method, a single side spin-on method, or a single side spray-on method, said coating comprising $P_2O_5$ and $SiO_2$;
    heating said substrate so as to produce the film comprising $SiO_2$ and $P_2O_5$, and an intermediate Phosphorus diffused layer on all sides of said substrate;
    etching out said a Phosphorus diffused layer except for said first side.

4. Method according to claim 1, wherein said pre-diffusing Phosphorus into a first side of said substrate comprises:
    blocking said second side of said substrate;
    heating said substrate in an atmosphere including $O_2$ and $P_2O_5$, so as to produce the film comprising $SiO_2$ and $P_2O_5$ and an intermediate Phosphorus diffused layer on all sides of said substrate.

5. Method according to claim 1, wherein said pre-diffusing Phosphorus into a first side of said substrate comprises:
    blocking said second side of said substrate;
    forming a coating on said first side using a screen-printed method, a single side spin-on method, or a single side spray-on method, said coating comprising $P_2O_5$ and $SiO_2$;
    heating said substrate so as to produce the film comprising $SiO_2$ and $P_2O_5$, and a Phosphorus diffused layer on all sides of said substrate.

6. Method according to claim 2, wherein heating said substrate is at a temperature of 800~900° C.

7. Method according to claim 4, wherein said second side of said substrate is blocked by way of forming a diffusion blocking layer on said second side.

8. Method according to claim 4, wherein said second side of said substrate is blocked by another substrate.

9. Method according to claim 1, wherein said first side of said substrate is blocked by a first side of another substrate.

10. Method according to claim 9, wherein said other substrate comprises a processed substrate which is at the time of said blocking, similarly processed as said substrate.

11. Method according to claim 1, wherein said first side of said substrate is blocked by way of covering said first side of said substrate with a coating layer.

12. Method according to claim 1, wherein said exposing of said second side of said substrate to a Boron diffusion source comprises exposing said substrate to an atmosphere including $O_2$ and $B_2O_3$.

13. Method according to claim 12, wherein said certain period of time lies between 30-120 minutes.

14. Method according to claim 12, wherein said certain temperature lies between 900-1000° C.

15. Method according to claim 12, wherein said $B_2O_3$ is produced by leading $N_2$ through a $BBr_3$ liquid.

16. A solar cell manufactured by a method according to claim 1.

17. Method according to claim 5, wherein said second side of said substrate is blocked by way of forming a diffusion blocking layer on said second side.

18. Method according to claim 5, wherein said second side of said substrate is blocked by another substrate.

19. Method according to claim 13, wherein said certain temperature lies between 900-1000° C.

20. Method according to claim 13, wherein said $B_2O_3$ is produced by leading $N_2$ through a $BBr_3$ liquid.

* * * * *

UNITED STATES PATENT AND TRADEMARK OFFICE
CERTIFICATE OF CORRECTION

PATENT NO. : 8,445,312 B2  Page 1 of 1
APPLICATION NO. : 12/742682
DATED : May 21, 2013
INVENTOR(S) : Mihailetchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 574 days.

Signed and Sealed this
Eighth Day of September, 2015

Michelle K. Lee
*Director of the United States Patent and Trademark Office*